(12) United States Patent
Scheiper et al.

(10) Patent No.: US 8,558,290 B2
(45) Date of Patent: Oct. 15, 2013

(54) SEMICONDUCTOR DEVICE WITH DUAL METAL SILICIDE REGIONS AND METHODS OF MAKING SAME

(75) Inventors: Thilo Scheiper, Dresden (DE); Stefan Flachowsky, Dresden (DE)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 13/217,975

(22) Filed: Aug. 25, 2011

(65) Prior Publication Data

US 2013/0049128 A1 Feb. 28, 2013

(51) Int. Cl.
| | |
|---|---|
| H01L 21/82 | (2006.01) |
| H01L 29/10 | (2006.01) |
| H01L 23/051 | (2006.01) |
| H01L 21/76 | (2006.01) |
| H01L 29/66 | (2006.01) |
| H01L 29/76 | (2006.01) |

(52) U.S. Cl.
USPC ............... 257/288; 257/18; 257/20; 257/178

(58) Field of Classification Search
USPC ............ 257/412, 413, E21.619, 380–410, 18, 257/20, 27, 178, 288, E21.507, E21.539; 438/233, 300, 307
See application file for complete search history.

(56) References Cited

U.S. PATENT DOCUMENTS

| | | | |
|---|---|---|---|
| 7,217,657 B2 | 5/2007 | Wieczorek et al. | |
| 7,861,406 B2 | 1/2011 | Lodha et al. | |
| 2002/0008295 A1* | 1/2002 | Yang et al. | 257/413 |
| 2003/0162349 A1 | 8/2003 | Wieczorek et al. | |
| 2005/0045924 A1* | 3/2005 | Tigelaar | 257/288 |
| 2007/0207583 A1* | 9/2007 | Burbach et al. | 438/276 |
| 2007/0269970 A1* | 11/2007 | Purtell et al. | 438/581 |
| 2008/0029831 A1* | 2/2008 | Chen et al. | 257/408 |
| 2008/0169484 A1* | 7/2008 | Chuang et al. | 257/190 |
| 2008/0191285 A1* | 8/2008 | Ko et al. | 257/369 |

* cited by examiner

*Primary Examiner* — Julio J Maldonado
*Assistant Examiner* — Moin Rahman
(74) *Attorney, Agent, or Firm* — Williams, Morgan & Amerson, P.C.

(57) ABSTRACT

Disclosed herein are various semiconductor devices with dual metal silicide regions and to various methods of making such devices. In one example, the device includes a gate electrode and a plurality of source/drain regions formed in a substrate proximate the gate electrode structure. The device further includes a first metal silicide region formed in each of the source/drain regions, wherein the first metal silicide region has an inner boundary and a second metal silicide region formed in each of the source/drain regions, wherein the second metal silicide region is positioned laterally between the inner boundary of the first metal silicide region and an edge of the gate electrode structure.

20 Claims, 4 Drawing Sheets

SEMICONDUCTOR DEVICE WITH DUAL METAL SILICIDE REGIONS AND METHODS OF MAKING SAME

BACKGROUND OF THE INVENTION

1. Field of the Invention

Generally, the present disclosure generally relates to the manufacturing of sophisticated semiconductor devices, and, more specifically, to various semiconductor devices with dual metal silicide regions and to various methods of making such devices.

2. Description of the Related Art

The fabrication of advanced integrated circuits, such as CPUs, storage devices, ASICs (application specific integrated circuits) and the like, requires a large number of circuit elements to be formed on a given chip area according to a specified circuit layout, wherein field effect transistors represent one important type of circuit element that substantially determines performance of the integrated circuits. Generally, a plurality of process technologies are currently practiced, wherein, for many types of complex circuitry, including field effect transistors, MOS technology is currently one of the most promising approaches due to the superior characteristics in view of operating speed and/or power consumption and/or cost efficiency. During the fabrication of complex integrated circuits using, for instance, MOS technology, millions of transistors, e.g., N-channel transistors (NMOS) and/or P-channel transistors (PMOS), are formed on a substrate including a crystalline semiconductor layer. A field effect transistor, irrespective of whether an NMOS transistor or a PMOS transistor is considered, typically comprises so-called PN junctions that are formed by an interface of highly doped regions, referred to as drain and source regions, with a slightly doped or non-doped region, such as a channel region, disposed adjacent to the highly doped regions.

Device designers are under constant pressure to increase the operating speed and electrical performance of transistors and integrated circuit products that employ such transistors. Given that the gate length (the distance between the source and drain regions) on modern transistor devices may be approximately 30-50 nm, and that further scaling is anticipated in the future, device designers have employed a variety of techniques in an effort to improve device performance, e.g., the use of high-k dielectrics, the use metal gate electrode structures, the incorporation of work function metals in the gate electrode structure and the use of channel stress engineering techniques on transistors (create a tensile stress in the channel region for NMOS transistors and create a compressive stress in the channel region for PMOS transistors). Stress engineering techniques typically involve the formation of specifically made silicon nitride layers that are selectively formed above appropriate transistors, i.e., a layer of silicon nitride that is intended to impart a tensile stress in the channel region of a NMOS transistor would only be formed above the NMOS transistors. Such selective formation may be accomplished by masking the PMOS transistors and then blanket depositing the layer of silicon nitride, or by initially blanket depositing the layer of silicon nitride across the entire substrate and then performing an etching process to selectively remove the silicon nitride from above the PMOS transistors. Conversely, for PMOS transistors, a layer of silicon nitride that is intended to impart a compressive stress in the channel region of a PMOS transistor is formed above the PMOS transistors. The techniques employed in forming such nitride layers with the desired tensile or compressive stress are well known to those skilled in the art.

In a field effect transistor, metal silicide regions are typically formed in the source/drain regions of a transistor to reduce the resistance when a conductive contact is formed to establish electrical connection to the source/drain regions. Such metal silicide regions may be made using a variety of different refractory metals, e.g., nickel, platinum, cobalt, etc., and they may be formed using techniques that are well known to those skilled in the art.

The present disclosure is directed to various semiconductor devices with dual metal silicide regions and to various methods of making such devices.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to various semiconductor devices with dual metal silicide regions and to various methods of making such devices. In one example, the device includes a gate electrode and a plurality of source/drain regions formed in a substrate proximate the gate electrode structure. The device further includes a first metal silicide region formed in each of the source/drain regions, wherein the first metal silicide region has an inner boundary and a second metal silicide region formed in each of the source/drain regions, wherein the second metal silicide region is positioned laterally between the inner boundary of the first metal silicide region and an edge of the gate electrode structure.

In another illustrative example, a device disclosed herein includes an NMOS transistor with a gate electrode structure and a PMOS transistor with a gate electrode structure positioned above said semiconducting substrate, a plurality of N-doped source/drain regions formed in a substrate proximate the gate electrode structure of said NMOS transistor and a plurality of P-doped source/drain regions formed in the substrate proximate the gate electrode structure of the PMOS transistor. In this example, the device further includes a first metal silicide region formed in each of the source/drain regions for the NMOS transistor and the PMOS transistor, wherein the first metal silicide regions having an inner boundary and a second metal silicide region formed in each of the N-doped source/drain regions for the NMOS transistor, wherein the second metal silicide region is positioned laterally between the inner boundary of the first metal silicide region in the N-doped source/drain regions and an edge of the gate electrode structure of the NMOS transistor.

BRIEF DESCRIPTION OF THE DRAWINGS

The disclosure may be understood by reference to the following description taken in conjunction with the accompanying drawings, in which like reference numerals identify like elements, and in which.

Figure 1A:
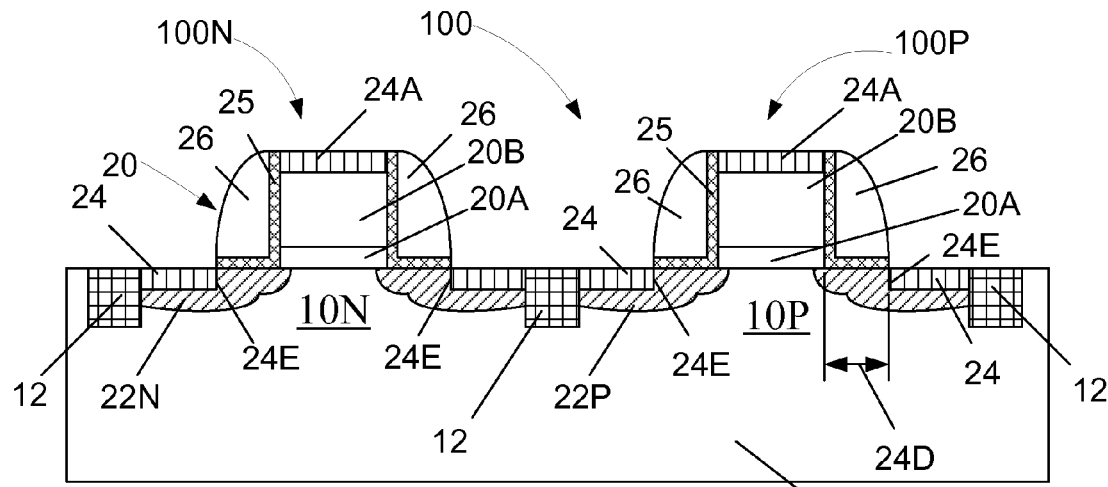
FIGS. 1A-1H depict one illustrative process flow disclosed herein for forming various semiconductor devices with dual metal silicide regions.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present disclosure is directed to various semiconductor devices with dual metal silicide regions and to various methods of making such devices while reducing or perhaps eliminating at least some of the problems discussed in the background section of this application. In some cases, the methods and devices may include a high-k dielectric material (k value greater than 10) and a metal-containing electrode material. As will be readily apparent to those skilled in the art upon a complete reading of the present application, the present method is applicable to a variety of technologies, e.g., NMOS, PMOS, CMOS, etc., and is readily applicable to a variety of devices, including, but not limited to, logic devices, memory devices, resistors, conductive lines, etc. With reference to FIGS. 1A-1H, various illustrative embodiments of the methods and devices disclosed herein will now be described in more detail.

The inventors have discovered that the lateral placement of metal silicide regions, such as nickel silicide regions, relative to the channel of a transistor can have an impact of the electrical performance characteristics of the transistor. More specifically, an illustrative nickel silicide region has a tensile stress when it is formed. Thus, for an NMOS transistor, it is desirable to place the nickel silicide region closer to the channel of an NMOS transistor to create the desired tensile stress in the channel region of the NMOS transistor, and thereby improve the $I_{on}/I_{off}$ performance characteristics of the NMOS transistor. Conversely, for PMOS transistors, since the nickel silicide imparts a tensile stress to the channel region, the placement of the nickel silicide region closer to the channel of an PMOS transistor creates an undesirable tensile stress in the channel region of the PMOS transistor, and thereby degrades the $I_{on}/I_{off}$ performance of the PMOS transistor. The present disclosure is directed to addressing these issues FIG. 1A is a simplified view of an illustrative semiconductor device 100 at an early stage of manufacturing that is formed above a semiconducting substrate 10. The device generally comprised an illustrative a NMOS transistor 100N and an illustrative PMOS transistor 100P formed in and above an NMOS region 10N and a PMOS region 10P, respectively, of the substrate 10. The active regions 10N, 10P are defined by illustrative trench isolation structures 12 formed in the substrate 10. The substrate 10 may have a variety of configurations, such the depicted bulk silicon configuration. The substrate 10 may also have a silicon-on-insulator (SOI) configuration that includes a bulk silicon layer, a buried insulation layer and an active layer, wherein semiconductor devices are formed in and above the active layer. Thus, the terms substrate or semiconductor substrate should be understood to cover all semiconductor structures. The substrate 10 may also be made of materials other than silicon.

At the point of fabrication depicted in FIG. 1A, each of the NMOS transistor 100N and an illustrative PMOS transistor 100P includes a schematically depicted gate electrode structure 20 that typically includes an illustrative gate insulation layer 20A and an illustrative gate electrode 20B. The gate insulation layer 20A may be comprised of a variety of different materials, such as, for example, silicon dioxide, a so-called high-k (k greater than 10) insulation material, etc. Similarly, the gate electrode 20B may also be of a material such as polysilicon or amorphous silicon, or it may be comprised of one or more metal layers that act as the gate electrode 20B. As will be recognized by those skilled in the art after a complete reading of the present application, the gate electrode structure 20 of the device 100 depicted in the drawings, i.e., the gate insulation layer 20A and the gate electrode 20B, is intended to be representative in nature. That is, the gate electrode structures 20 may be comprised of a variety of different materials and may they have a variety of configurations, and the gate electrode structures 20 may be made using either so-called "gate-first" or "gate-last" techniques. The gate electrode structure for the NMOS transistor 100N may contain different materials that the gate electrode structure 20 of the PMOS transistor 100P. For ease of explanation, the illustrative transistors 100N, 100P will be depicted as having polysilicon gate electrodes 20B, however, the present invention should not be considered as limited to such an illustrative embodiment.

Also as depicted in FIG. 1A, each of the transistors 100N, 100P also includes a plurality of source/drain regions 22N, 22P, respectively, a liner layer 25, spacer material 26, and first metal silicide regions 24 formed in the source/drain regions 22N, 22P. In this illustrative example, where the gate electrodes 20B are made of polysilicon, a metal silicide region 24A is also formed on the gate electrodes 20B. The first metal silicide regions 24 have an inner boundary 24E, and they may have a lateral (width) dimension that may range from approximately 50-60 nm, depending upon the particular application. The depth or thickness of the first metal silicide regions 24 may also vary depending upon the particular application, e.g., 15-25 nm. The metal silicide regions 24, 24A may be made of the same or different metal silicides, and they may be formed at different times. In some cases, where a metal gate electrode 20B is involved, the metal silicide regions 24A may be omitted. The spacer material 26 is also intended to be representative in nature in that it may be a single spacer of a combination of multiple spacers. In one illustrative example, the spacer material 26 is made of a single sidewall spacer made of, for example, silicon nitride, wherein the spacer has a width at its base of about 40-50 nm, although this width may vary depending upon the application.

In general, the base width of the spacer material 26 and the thickness of the liner layer 25 (if present) should be sized such that the inner boundary 24E of the first metal silicide regions 24 on the PMOS transistor 100P are positioned a desired distance from the channel region of the PMOS transistor 100P. Stated another way, in one illustrative example, the spacer material 26 is employed to laterally position the inner boundary 24E of the first metal silicide regions 24 on the PMOS transistor 100P a desired lateral distance 24D from the edge of the gate electrode structure 20. In one illustrative example, the lateral distance 24D may range from approximately 20-30 nm, although this lateral distance may vary depending upon the application.

The various structures and regions of the transistors 100N, 100P depicted in FIG. 1A may be formed by performing well known processes. For example, the gate structures 20 may be formed by depositing various layer of material and thereafter performing one or more etching processed to define the basic layer stack of the gate electrode structures 20. The liner layer 25 may be comprised a relatively thin, e.g., 2-3 nm, layer of, for example, silicon dioxide, that is formed by performing a conformal chemical vapor deposition (CVD) process. The spacer material 26 may be formed by depositing a layer of spacer material, such as silicon nitride, and thereafter performing an anisotropic etching process on the layer of spacer material. The source/drain regions 22N, 22P may be formed using know ion implantation techniques using the appropriate dopant materials, i.e., N-type dopants and P-type dopants, respectively. The metal silicide regions 24, 24A may be formed by performing traditional silicidation processes, i.e., depositing a layer of refractory metal, performing a heating process causing the refractory metal to react with underlying silicon containing material, removing unreacted portions of the layer of refractory metal (e.g., nickel, platinum, or combinations thereof), followed perhaps by performing an additional heating process. The metal silicide regions 24, 24A may be comprised of any metal silicide, and they may both be formed at the same or at different times. In one illustrative example, the metal silicide regions 24, 24A are both comprised of nickel-platinum silicide, they are both formed at the same time and they both have a thickness that ranges from 15-50 nm.

Figure 1B:
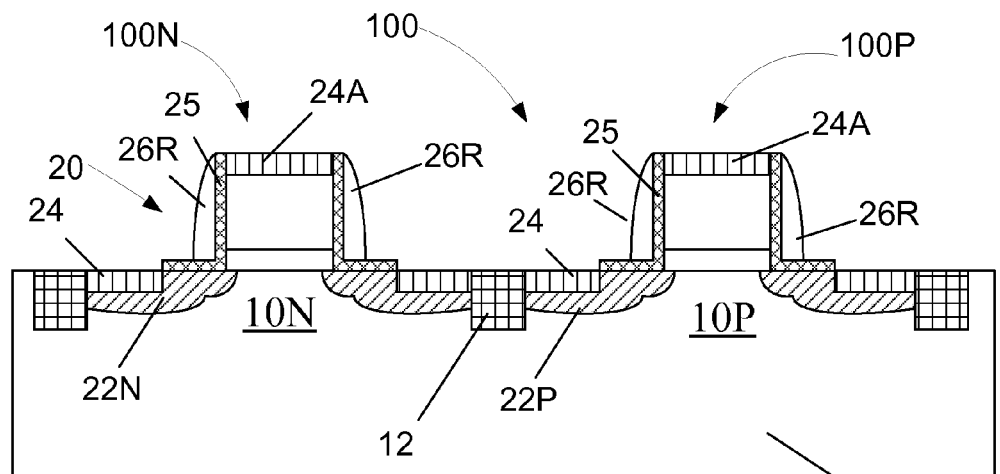

Next, as shown in FIG. 1B, an etching process is performed to reduce the thickness of the spacer material 26 on both the NMOS transistor 100N and the PMOS transistor 100P. The reduced spacer 26R may, in one example, have a base thickness that ranges from about 10-20 nm. In one illustrative embodiment, the etching process may be a dry anisotropic etching process that is performed with a chemistry that is selective relative to the underlying liner layer 25.

Figure 1C:
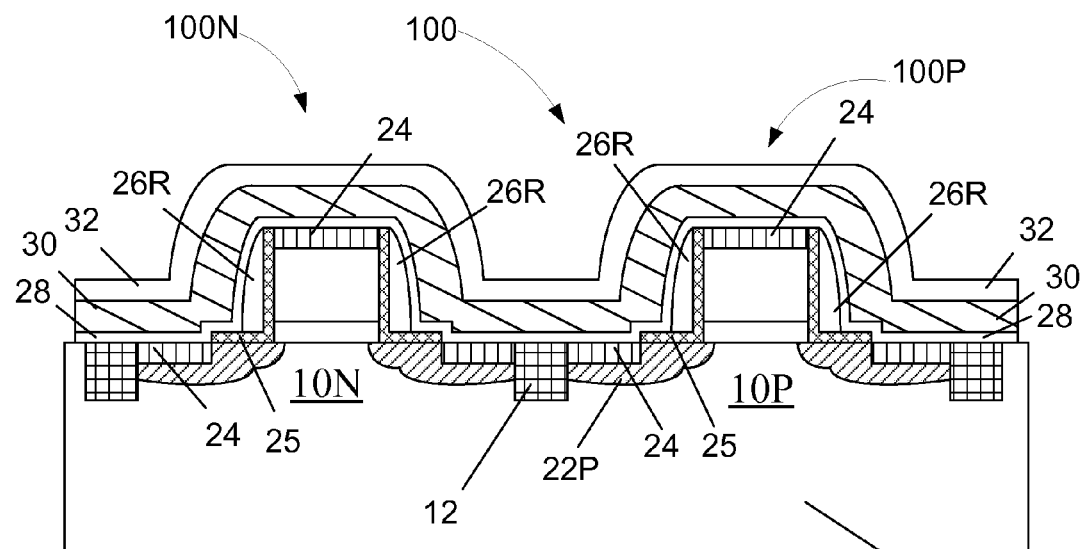

Next, as shown in FIG. 1C a first etch stop layer 28, a compressive stress-inducing layer 30 and a second etch stop layer 32 are formed above the device 100. The layers 28, 30 and 32 maybe formed from a variety of materials and they may be formed by performing a variety of known techniques. In one illustrative example, the first etch stop layer 28 and the second etch stop layer 32 are both comprised of silicon dioxide, they have a thickness of about 4-6 nm and 10-15 nm, respectively, and they may be formed by performing a process such as a CVD process or an atomic layer deposition (ALD) process. The compressive stress-inducing layer 30 may be comprised of a material such as silicon nitride, it may have a thickness of about 50-60 nm, and it may be formed using a CVD process wherein the parameters of the CVD process are adjusted and controlled such that the compressive stress-inducing layer 30 exhibits the desired compressive stress. The manner in which this is accomplished is well known to those skilled in the art. The purpose of the compressive stress-inducing layer 30 is to impart a desired compressive stress to the channel region of the PMOS transistor 100P so as to increase the mobility of the charge carriers, i.e., holes, to thereby improve the electrical performance characteristics of the PMOS transistor 100P. The compressive stress inducing layer 30 also serves as a hard mask during the second silicide formation process on the NMOS transistor 100N, as discussed below. Alternatively, a regular hard mask, without any designed stress in the hard mask, may be formed in lieu of the compressive stress inducing layer 30.

Figure 1D:
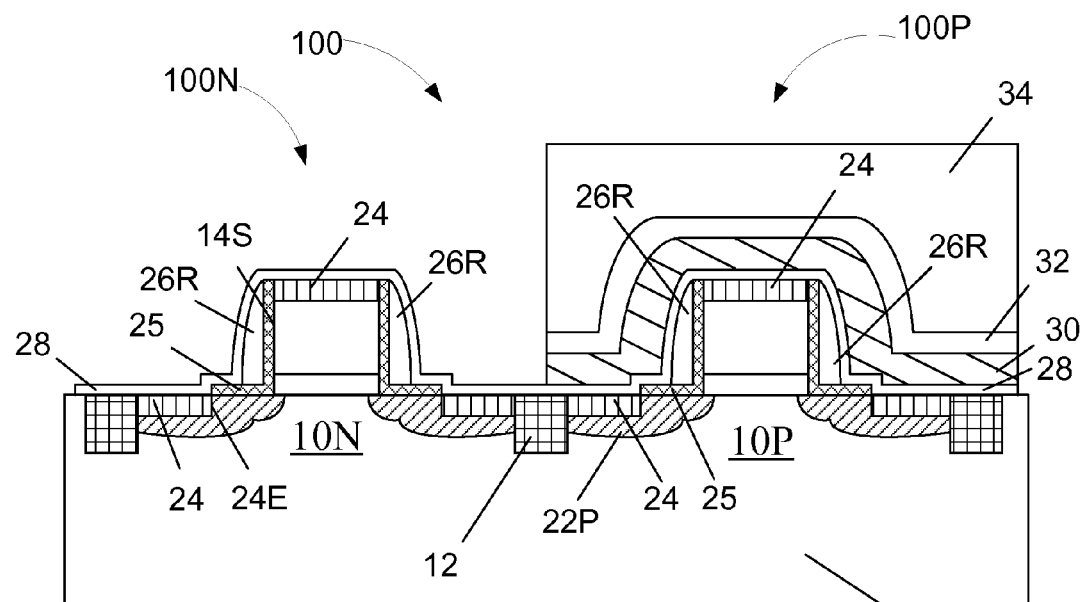

Next, as shown in FIG. 1D, a masking layer 34, e.g., a photoresist mask is formed on the device 100 to cover the PMOS transistor 100P while leaving the NMOS transistor 100N exposed for further processing. Thereafter, one or more etching processes, using different etch chemistries, is performed to remove the compressive stress-inducing layer 30 and the second etch stop layer 32 from above the NMOS transistor 100N.

Figure 1E:
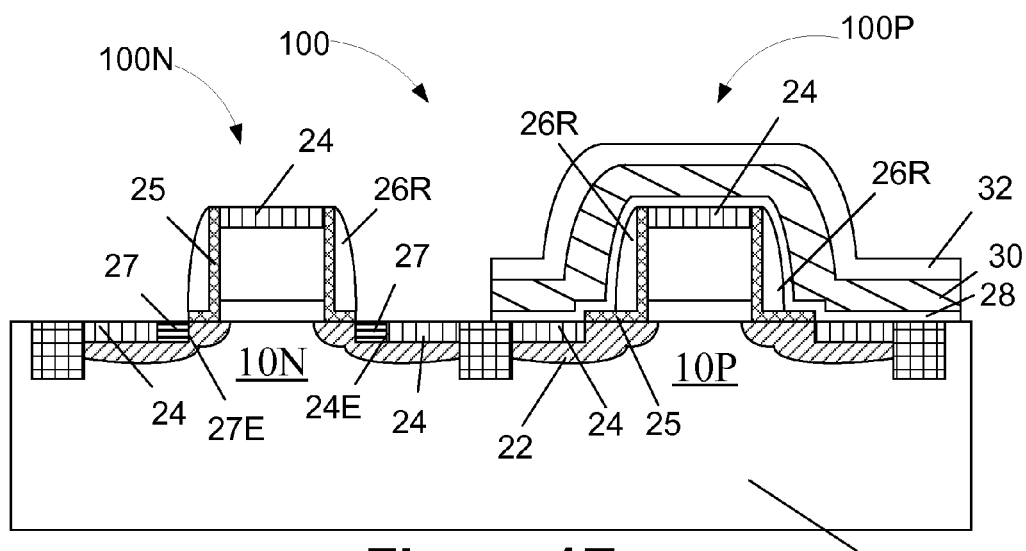

Then, as shown in FIG. 1E, pre-clean process is performed on the transistor 100N to ensure that the surface of the substrate 10 is clean with respect to oxide materials. The pre-clean removes the first etch stop layer 28 in the N-active region 10N of the device 100. The second etch stop layer 32, which is also made of oxide, should be of sufficient thickness such that it can survive this pre-clean process and still remain viable as an etch stop layer for subsequent processing operations that will be performed on the PMOS transistor 100P. Thereafter, a second metal silicide region 27 is formed in the N-doped source-drain regions 22N of the NMOS transistor 100N. For explanation purposes only, the second metal silicide region 27 is depicted with different cross-hatching than that of the first metal silicide region 24. The second metal silicide region 27 may be formed using traditional silicidation techniques, such as those described above. In one illustrative example, the second metal silicide region 27 has a lateral width that ranges from approximately 10-15 nm, although this lateral width may vary depending upon the application and the amount or reduction of the width of the original spacer material 26. Using the present techniques, the inner boundary 27E of the second metal silicide region 27 may be positioned closer to the channel region of the NMOS transistor 100N so as to improve the electrical performance characteristics of the NMOS transistor 100N. In some cases, the second metal silicide region 27 may actually contact the boundary 24E of the first metal silicide region 24. The first metal silicide region 24 and the second metal silicide region 27 on the NMOS transistor 100N may be made of the same or different metal silicides, and they may have the same or different thicknesses. In one illustrative example, the first metal silicide region 24 and the second metal silicide region 27 on the NMOS transistor 100N are both comprised of nickel-platinum silicide and they both have a thickness that ranges from 15-25 nm.

Figure 1F:
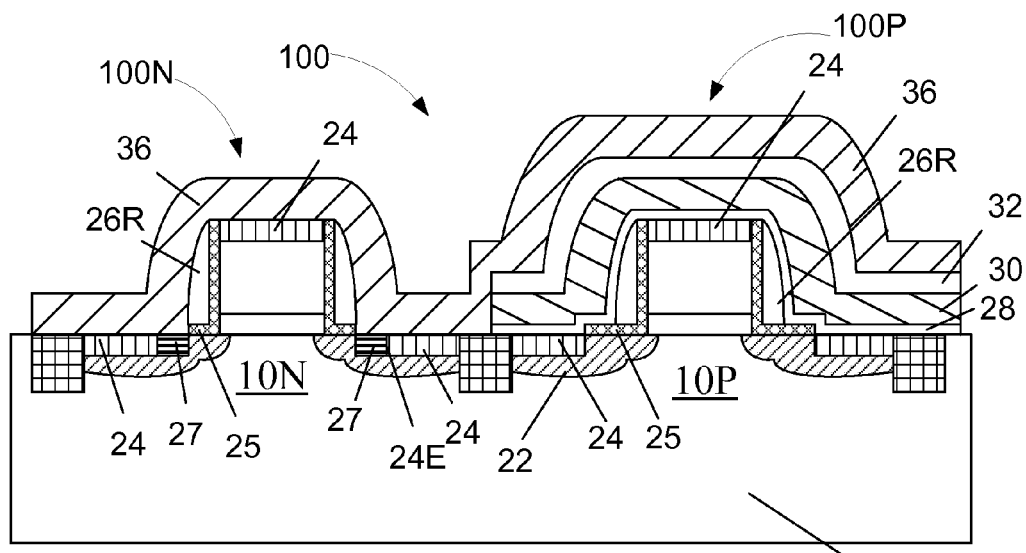

Next, as shown in FIG. 1F, a tensile stress-inducing layer 36 is formed above the device 100. The tensile stress-inducing layer 36 may be formed from a variety of materials and it may be formed by performing a variety of known techniques. In one illustrative example, the tensile stress-inducing layer 36 may be comprised of a material such as silicon nitride, it may have a thickness of about 50-60 nm, and it may be formed using a CVD process wherein the parameters of the CVD process are adjusted and controlled such that the tensile stress-inducing layer 36 exhibits the desired tensile stress. The manner in which this is accomplished is well known to those skilled in the art. The purpose of the tensile stress-inducing layer 36 is to impart a desired tensile stress to the channel region of the NMOS transistor 100N so as to increase the mobility of the charge carriers, i.e., electrons, to thereby improve the electrical performance characteristics of the NMOS transistor 100N.

Figure 1G:
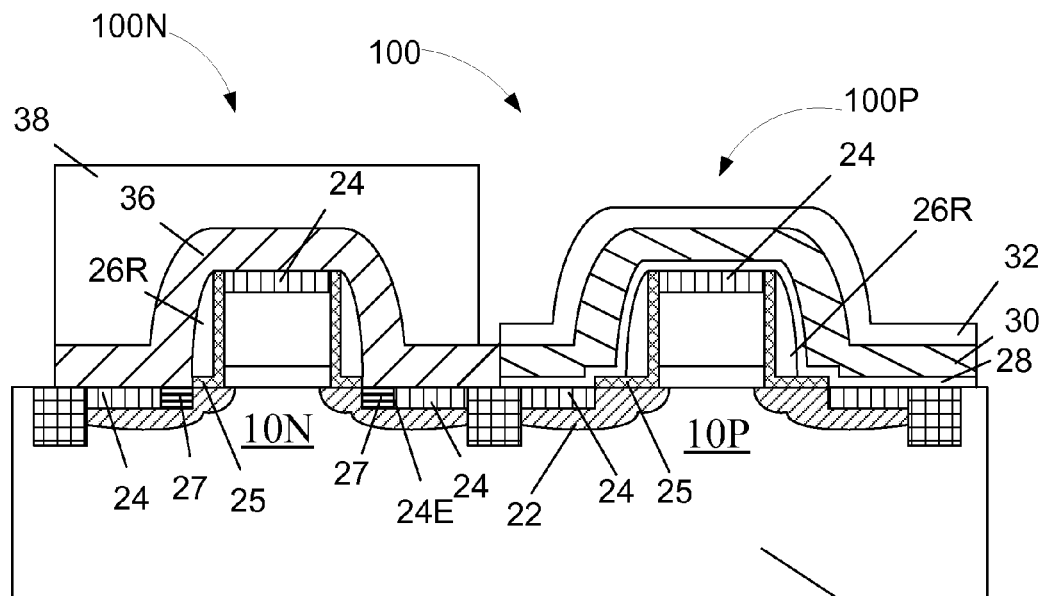

Next, as shown in FIG. 1G, a masking layer 38, e.g., a photoresist mask is formed on the device 100 to cover the NMOS transistor 100N while leaving the PMOS transistor 100P exposed for further processing. Thereafter, one or more etching processes are performed to remove the tensile stress-inducing layer 36 from above the PMOS transistor 100P.

Figure 1H:
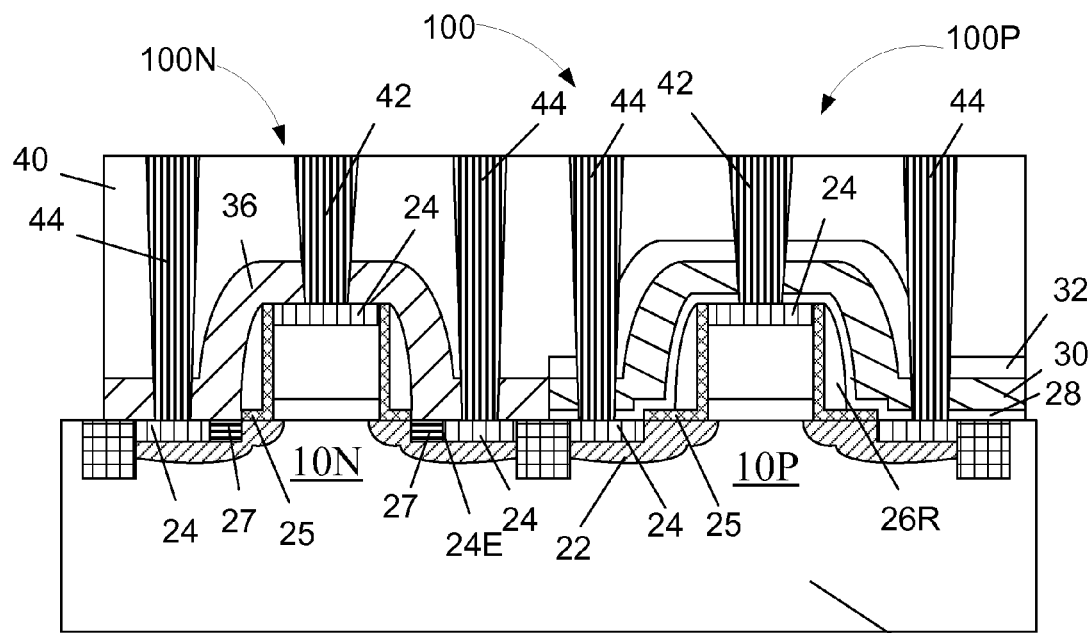

Thereafter, conductive contacts are formed on the device 100 using traditional materials and techniques. For example, FIG. 1H depicts the device 100 after a layer of insulating material 40, e.g., silicon dioxide, and illustrative conductive gate contacts 42 and conductive source/drain contacts 44 are formed on the device 100. Thereafter, although not depicted in the drawings, various metallization structures are formed above the device 100.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed is:

1. A device, comprising:
    a gate electrode structure positioned above a semiconducting substrate;
    a plurality of source/drain regions formed in said substrate proximate said gate electrode structure;
    a first metal silicide region formed in each of said source/drain regions, said first metal silicide region having an inner boundary; and
    a second metal silicide region formed in each of said source/drain regions, said second metal silicide region being positioned laterally between said inner boundary of said first metal silicide region and an edge of said gate electrode structure, wherein said first metal silicide region and said second metal silicide region have a substantially same thickness.

2. The device of claim 1, wherein said first metal silicide region and said second metal silicide region are comprised of the same metal silicide.

3. The device of claim 1, wherein said first metal silicide region and said second metal silicide region are comprised of the different metal silicides.

4. The device of claim 1, wherein said first metal silicide region is formed prior to said second metal silicide region.

5. The device of claim 1, wherein said device is an NMOS transistor and said source/drain regions are doped with an N-type dopant material.

6. The device of claim 1, wherein said first metal silicide region has a lateral width dimension of approximately 50-60 nm and said second metal silicide region has a lateral dimension of approximately 10-15 nm.

7. The device of claim 1, wherein said second metal silicide region contacts said inner boundary of said first metal silicide region.

8. A device, comprising:
    an NMOS transistor with a gate electrode structure positioned above a semiconducting substrate and a PMOS transistor with a gate electrode structure positioned above said semiconducting substrate;
    a plurality of N-doped source/drain regions formed in said substrate proximate said gate electrode structure of said NMOS transistor;
    a plurality of P-doped source/drain regions formed in said substrate proximate said gate electrode structure of said PMOS transistor;
    a first metal silicide region formed in each of said source/drain regions for said NMOS transistor and said PMOS transistor, said first metal silicide region having an inner boundary; and
    a tensile-stressed second metal silicide region formed in each of said N-doped source/drain regions for said NMOS transistor and having a substantially same thickness as said first metal silicide regions, said second metal silicide region being positioned laterally between said inner boundary of said first metal silicide region in said N-doped source/drain regions and an edge of said gate electrode structure of said NMOS transistor, wherein said second metal silicide regions create a tensile stress in a channel region of said NMOS transistor.

9. The device of claim 8, wherein said first metal silicide region and said second metal silicide region in said N-doped source/drain regions are comprised of the same metal silicide.

10. The device of claim 8, wherein said first metal silicide region and said second metal silicide region in said N-doped source/drain regions are comprised of different metal silicides.

11. The device of claim 8, wherein said first metal silicide regions are formed in said N-doped source/drain regions and said P-doped source/drain regions prior to forming said second metal silicide region in said N-doped source/drain regions.

12. The device of claim 8, wherein said first metal silicide region in said N-doped source/drain regions has a lateral dimension of approximately 50-60 nm and said second metal silicide region in said N-doped source/drain regions has a lateral dimension of approximately 10-15 nm.

13. The device of claim 8, wherein said second metal silicide region in said N-doped source/drain regions contacts said first metal silicide region in said N-doped source/drain region.

14. A method, comprising:
    forming a gate electrode structure for an NMOS transistor above a semiconducting substrate;
    forming a plurality of N-doped source/drain regions in said substrate proximate said gate electrode structure;
    performing a first silicidation process to form a first metal silicide region in each of said N-doped source/drain regions, said first metal silicide region having an inner boundary; and
    after forming said first metal silicide regions, performing a second silicidation process to form a tensile-stressed second metal silicide region in each of said N-doped source/drain regions so as to have a substantially same thickness as said first metal silicide regions, said second metal silicide region being positioned laterally between said inner boundary of said first metal silicide region and an edge of said gate electrode structure, wherein said second metal silicide regions create a tensile stress in a channel region of said NMOS transistor.

15. The method of claim 14, further comprising forming a tensile stress inducing layer above said gate electrode structure and said N-doped source/drain regions.

16. A method, comprising:
forming a gate electrode structure for an NMOS transistor above a semiconducting substrate;
forming a gate electrode structure for a PMOS transistor above a semiconducting substrate;
forming a plurality of N-doped source/drain regions in said substrate proximate said gate electrode structure of said NMOS transistor;
forming a plurality of P-doped source/drain regions in said substrate proximate said gate electrode structure of said PMOS transistor;
performing a first silicidation process to form a first metal silicide region in each of said N-doped source/drain regions and in each of said P-doped source/drain regions, said first metal silicide region having an inner boundary; and
after forming said first metal silicide regions, performing a second silicidation process to form a second metal silicide region in each of said N-doped source/drain regions, said second metal silicide region being positioned laterally between said inner boundary of said first metal silicide region and an edge of said gate electrode structure of said NMOS transistor, wherein said first and second metal silicide regions are formed in said N-doped source/drain regions so as to have a substantially same thickness.

17. The method of claim 16, further comprising forming a tensile stress inducing layer above said gate electrode structure of said NMOS transistor and above said N-doped source/drain regions of said NMOS transistor.

18. The method of claim 17, further comprising forming a compressive stress inducing layer above said gate electrode structure of said PMOS transistor and above said P-doped source/drain regions of said PMOS transistor.

19. The method of claim 16, wherein forming said second metal silicide regions in said N-doped source/drain regions comprises creating a tensile stress in a channel region of said NMOS transistor.

20. The device of claim 1, wherein said second metal silicide regions formed in said plurality of source/drain regions create a tensile stress in a channel region of a transistor element comprising said gate electrode structure and said plurality of source/drain regions.

* * * * *